(12) United States Patent
Sato et al.

(10) Patent No.: US 7,112,800 B2
(45) Date of Patent: Sep. 26, 2006

(54) RADIOLOGICAL IMAGE PICKUP APPARATUS

(75) Inventors: Kenji Sato, Otsu (JP); Koji Watadani, Kyoto (JP)

(73) Assignee: Shimadzu Corporation, Kyoto (JP)

( * ) Notice: Subject to any disclaimer, the term of this patent is extended or adjusted under 35 U.S.C. 154(b) by 246 days.

(21) Appl. No.: 10/813,339

(22) Filed: Mar. 30, 2004

(65) Prior Publication Data
US 2004/0211908 A1 Oct. 28, 2004

(30) Foreign Application Priority Data
Apr. 25, 2003 (JP) ............................ 2003-122258

(51) Int. Cl.
G01T 1/24 (2006.01)
(52) U.S. Cl. ............................................. 250/370.09
(58) Field of Classification Search ............ 250/370.09
See application file for complete search history.

(56) References Cited

U.S. PATENT DOCUMENTS 6,627,896 B1 * 9/2003 Hashimoto et al. .... 250/370.11
6,667,480 B1 * 12/2003 Kajiwara et al. ...... 250/370.01
6,667,481 B1 * 12/2003 Teranuma et al. ..... 250/370.09
2003/0010925 A1 * 1/2003 Watanabe .............. 250/370.15

FOREIGN PATENT DOCUMENTS

| JP | 58-139477 A | 8/1983 |
| JP | 2002-214352 A | 7/2002 |
| JP | 2003-014860 | 1/2003 |

* cited by examiner

Primary Examiner—Constantine Hannaher
(74) Attorney, Agent, or Firm—Rankin, Hill, Porter & Clark LLP

(57) ABSTRACT

A portion corresponding to a surface lid section of a cabinet is formed using a nonconductive material. A structure is molded by using an insulating substance, an insulating plate member, and an insulating weir member so as to entirely cover a radiation-sensitive semiconductor and a voltage application electrode on an active matrix substrate. The area from the outer frame of the cabinet to the margin of the voltage application electrode is shielded by a shield member so as to cover any area, other than the portion just above the voltage application electrode, from above the insulating plate member.

20 Claims, 5 Drawing Sheets

RADIOLOGICAL IMAGE PICKUP APPARATUS

BACKGROUND OF THE INVENTION

1. Field of the Invention

This invention relates to a radiological image pickup apparatus with a radiation detection section of direct conversion type used in a medical field, an industrial field, a nuclear field, etc., and in particular to an art for improving the S/N ratio of the radiological image pickup apparatus.

2. Description of the Related Art

Radiation (for example, X-ray) detectors include those of indirect conversion type wherein radiation (for example, X-rays) is first converted into light and then the provided light is converted into an electric signal by photoelectric conversion and those of direct conversion type wherein incident radiation is converted directly into an electric signal by a radiation-sensitive semiconductor.

The latter radiation detection section of direct conversion type applies a predetermined bias voltage to a voltage application electrode formed on the surface of a radiation-sensitive semiconductor and collects carriers produced with incidence of radiation from a carrier collection electrode formed on the back of the semiconductor and then takes out the carriers as an electric signal, thereby detecting radiation.

Particularly, to use an amorphous semiconductor such as amorphous selenium as a radiation-sensitive semiconductor, the amorphous semiconductor can be easily formed as a thick film of a large area by a method of vacuum evaporation, etc., and thus is fitted for forming a two-dimensional array radiation detection section requiring a large area.

Figure 8:
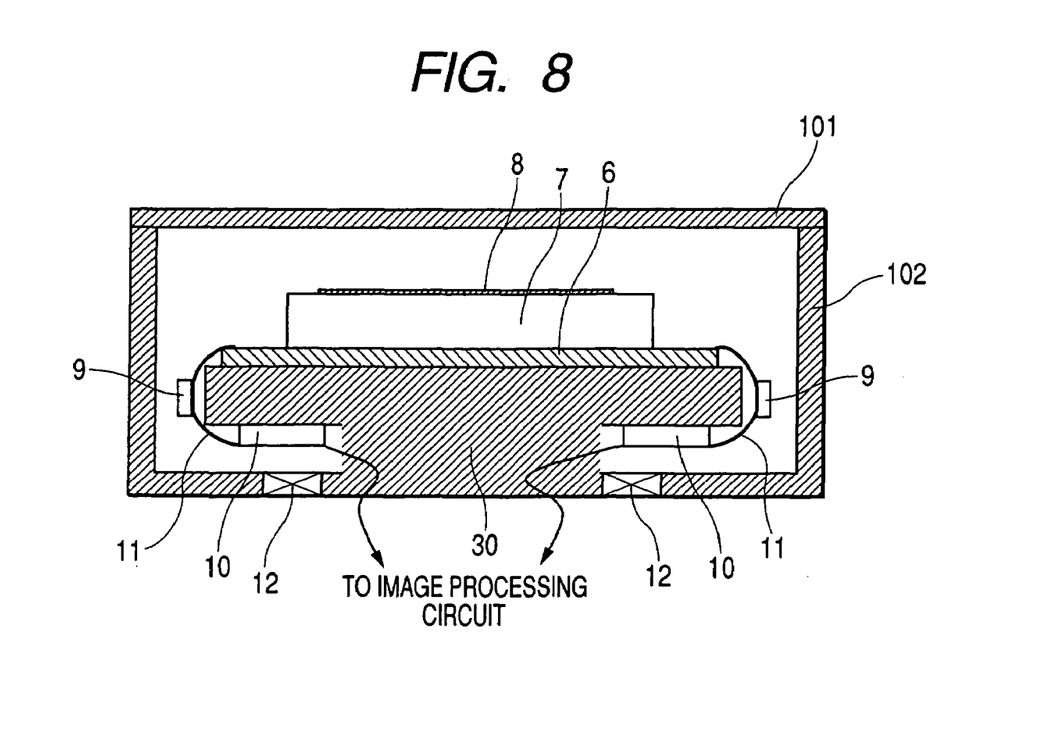
FIG. 8 is a schematic sectional view to show the configuration of a radiation detection section in a related art.

As shown in FIG. 8, a two-dimensional array radiological image pickup apparatus in a related art comprises a radiation detection section having an active matrix substrate 6, a radiation-sensitive semiconductor 7, and a voltage application electrode 8, an LSI chip 9, a signal processing circuit 10 and a flexible wiring film 11. The active matrix substrate 6 is formed with a charge-storage capacitor, a charge read switching element, and a pixel electrode for each unit cell with signal lines and scanning lines disposed like a lattice on the substrate. The radiation-sensitive semiconductor 7 produces charges as radiation is incident and is formed on the active matrix substrate 6. The voltage application electrode 8 is formed on the surface of the semiconductor 7. The LSI chip 9 is formed on the flexible wiring film 11. A two-dimensional radiation detection signal can be obtained by applying a predetermined bias voltage to the voltage application electrode 8 and turning on the switching elements in order for each row by the LSI chip 9 and then reading the charges stored in the charge-storage capacitors for each column through the LSI chip 9 and the signal processing circuit 10.

To use the radiation detection section in FIG. 8, for example, to detect a translucent X-ray image of an X-ray fluoroscopic and radiographic apparatus, a translucent X-ray image can be provided based on the two-dimensional radiation detection signal output from the radiation detection section. To design the two-dimensional array radiation detection section as a compact size, the LSI chip 9 on which charge detection amplifiers and a gate driver are integrated is not separately shielded and is often used in a state in which it is exposed or is only resin-molded. Therefore, the radiation detection section is housed in a conductive cabinet 102 made of metal or a carbon material for use. Thus, it is a common practice to house the radiation detection section in the cabinet for use (JP-A-2002-214352).

However, as shown in FIG. 8, in the radiation detection section of direct conversion type, capacitors are formed between the voltage application electrode 8 and a surface lid section 101 corresponding to a surface lid of the cabinet 102 and when a bias voltage is applied, charges are stored. In this state, if the surface lid section 101 vibrates with vibration of a cooling fan 12, etc., the capacitance of each capacitor fluctuates, so that charge transfer occurs and noise is detected. The surface lid section 101 of the cabinet 102 serves as an incidence window member of radiation and thus needs to be made thin as much as possible and is comparatively easily affected by vibration; it is one of S/N degradation factors.

SUMMARY OF THE INVENTION

It is an object of the invention to provide a radiological image pickup apparatus wherein noise factors occurring in a two-dimensional array radiation detection section of direct conversion type are excluded and the S/N ratio of the radiological image pickup apparatus is improved.

According to a first aspect of the present invention, there is provided a radiological image pickup apparatus comprising:

a radiation detection section including an active matrix substrate, a radiation-sensitive semiconductor formed on the active matrix substrate, and a voltage application electrode formed on the semiconductor, the active matrix substrate including a charge-storage capacitor, a charge read switching element, and a pixel electrode for each unit cell with signal lines and scanning lines disposed like a lattice on the substrate; and a cabinet for retaining the radiation detection section therein, wherein at least a portion just above the voltage application electrode is formed of a nonconductive material in a surface lid section of the cabinet opposed to the voltage application electrode.

The present invention of a second aspect is characterized by the fact that in the radiological image pickup apparatus of the first aspect, the whole surface lid section of the cabinet is formed of a nonconductive material.

The present invention of a third aspect is characterized by the fact that in the radiological image pickup apparatus of the first or second aspect, any other portion than the nonconductive material portion in the cabinet is formed of a conductive material The present invention of a fourth aspect is characterized by the fact that in the radiological image pickup apparatus of any of the first to third aspects, the radiation-sensitive semiconductor and the voltage application electrode on the active matrix substrate are molded by using an insulating substance so as to cover the whole of the radiation-sensitive semiconductor and the voltage application electrode by the insulating substance, and wherein a shield member made of a conductive material is formed so as to cover any other area than the portion just above the voltage application electrode from a side wall of the cabinet to a margin of the voltage application electrode.

The present invention of a fifth aspect is characterized by the fact that in the radiological image pickup apparatus of the fourth aspect, charge detection amplifiers and a gate driver connected to ends of the signal lines and the scanning lines on the active matrix substrate are formed on the active matrix substrate and molded by using the insulating substance.

The present invention of a sixth aspect is characterized by the fact that in the radiological image pickup apparatus of the fourth or fifth aspect, the shield member is formed of a material made of metal with an atom number in the range of 40 to 90, for example, Mo (42), Ag (47), In (49), Sn (50), W (74), or Pb (82) or a material whose part is the metal.

The present invention of a seventh aspect is characterized by the fact that in the radiological image pickup apparatus of any of the fourth to sixth aspects, the shield member is electrically connected to a portion formed of a conductive material in an extension of the cabinet.

Next, the functions of the radiological image pickup apparatus according to the invention will be discussed.

In the radiological image pickup apparatus according to the first aspect of the present invention, the surface lid section of the conductive cabinet opposed to the voltage application electrode is formed using a nonconductive material of plastic, etc., so that a capacitor is not formed between the voltage application electrode and the surface lid section of the cabinet and when a bias voltage is applied, charges are not stored. Thus, if the cooling fan, etc., causes the surface lid section to vibrate, charge transfer does not occur and noise is not detected. Consequently, it is made possible to thin as much as possible the surface lid section of the cabinet also serving as an incidence window member of radiation.

In the radiological image pickup apparatus according to the second aspect of the present invention, further the whole surface lid section is formed of a nonconductive material, so that it is made possible to more remove the detrimental effect of noise.

In the radiological image pickup apparatus according to the third aspect of the present invention, further any other portion than the portion in the cabinet opposed to the voltage application electrode is formed of a conductive material, so that the noise problem caused by vibration of the surface lid section can be solved as in the present invention of the first or second aspect, and it is made possible to sufficiently shield the inside from an external magnetic field, etc., and thus it is made possible to detect radiation with less noise.

In the radiological image pickup apparatus according to the fourth aspect of the present invention, further the shield member made of a conductive material is formed so as to cover any other area than the portion just above the voltage application electrode from the side wall of the cabinet to the margin of the voltage application electrode. Therefore, electrostatic noise occurring as the surface lid section of the cabinet formed using a nonconductive material of plastic, etc., vibrates with the surface lid section naturally charged is prevented from entering the charge detection amplifiers or the gate driver. The radiation-sensitive semiconductor and the voltage application electrode on the active matrix substrate are molded by using the insulating substance so as to cover the whole of the radiation-sensitive semiconductor and the voltage application electrode, so that the shield member formed of a conductive material can be brought close to the proximity of the pole of the voltage application electrode and it is made possible to provide the shield effect more perfectly.

In the radiological image pickup apparatus according to the fifth aspect of the present invention, the charge detection amplifiers and the gate driver are formed on the active matrix substrate and the structure is molded by using the insulating substance so as to cover the whole also containing the charge detection amplifiers and the gate driver together with the radiation-sensitive semiconductor and the voltage application electrode, so that the whole can be made a flat shape and shield with the conductive material can be conducted easily and reliably.

In the radiological image pickup apparatus according to the sixth aspect of the present invention, the shield member made of a conductive material for shielding the area from the outer frame of the cabinet to the margin of the voltage application electrode is formed of a material made of metal with a high atom number in the range of 40 to 90 or a material whose part is the metal, so that the material acts as a shield material of radiation and can protect the parts of the charge detection amplifiers and the gate driver easily affected by radiation damage.

In the radiological image pickup apparatus according to the seventh aspect of the present invention, the shield member made of a conductive material for shielding the area from the outer frame of the cabinet to the margin of the voltage application electrode is electrically connected to the conductive portion of the cabinet, so that the shield effect can be provided more reliably.

DETAILED DESCRIPTION OF THE INVENTION

Figure 1:
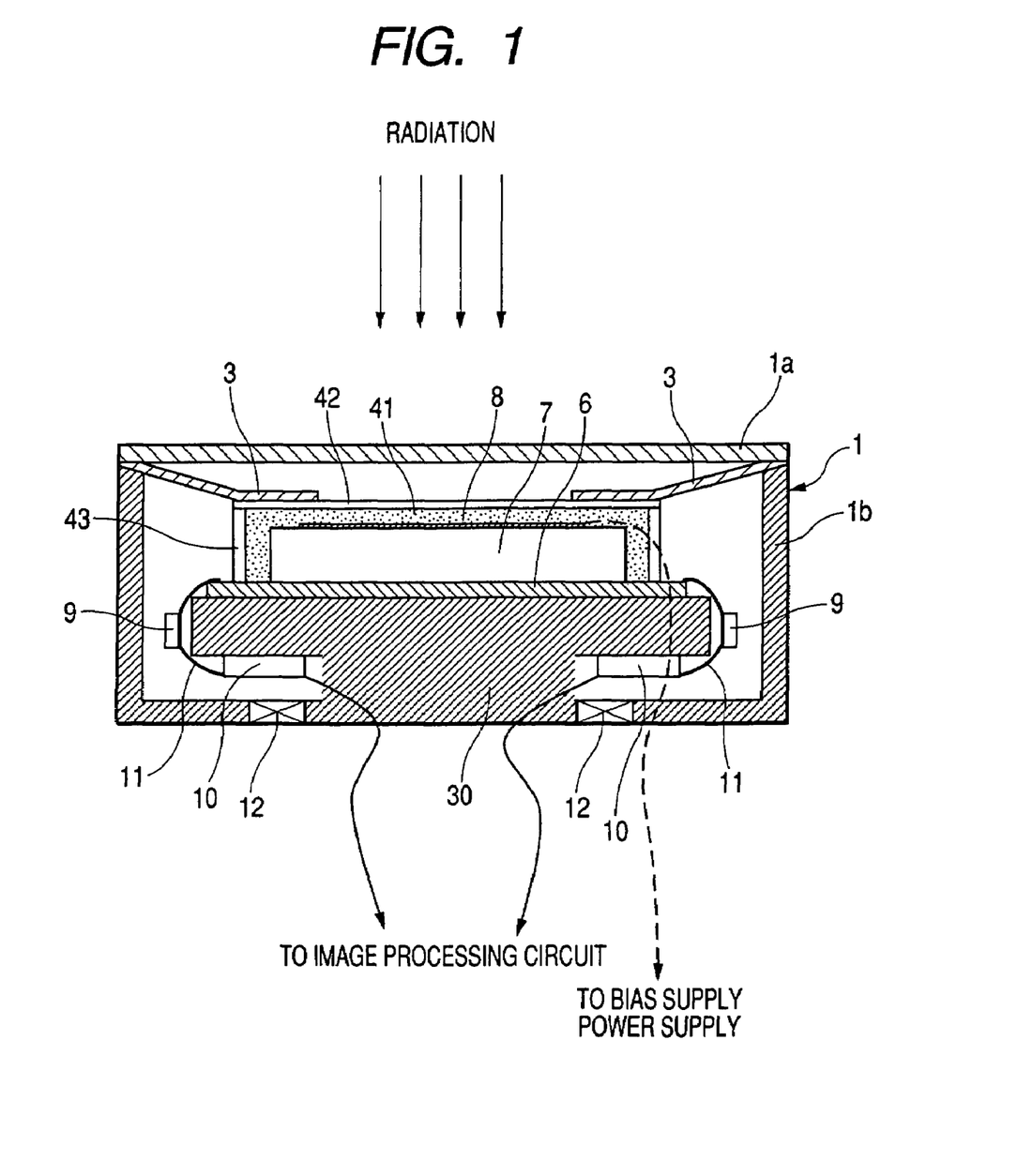
FIG. 1 is a schematic sectional view to show the configuration of a radiation detection section according to an embodiment of the invention.
Figure 2:
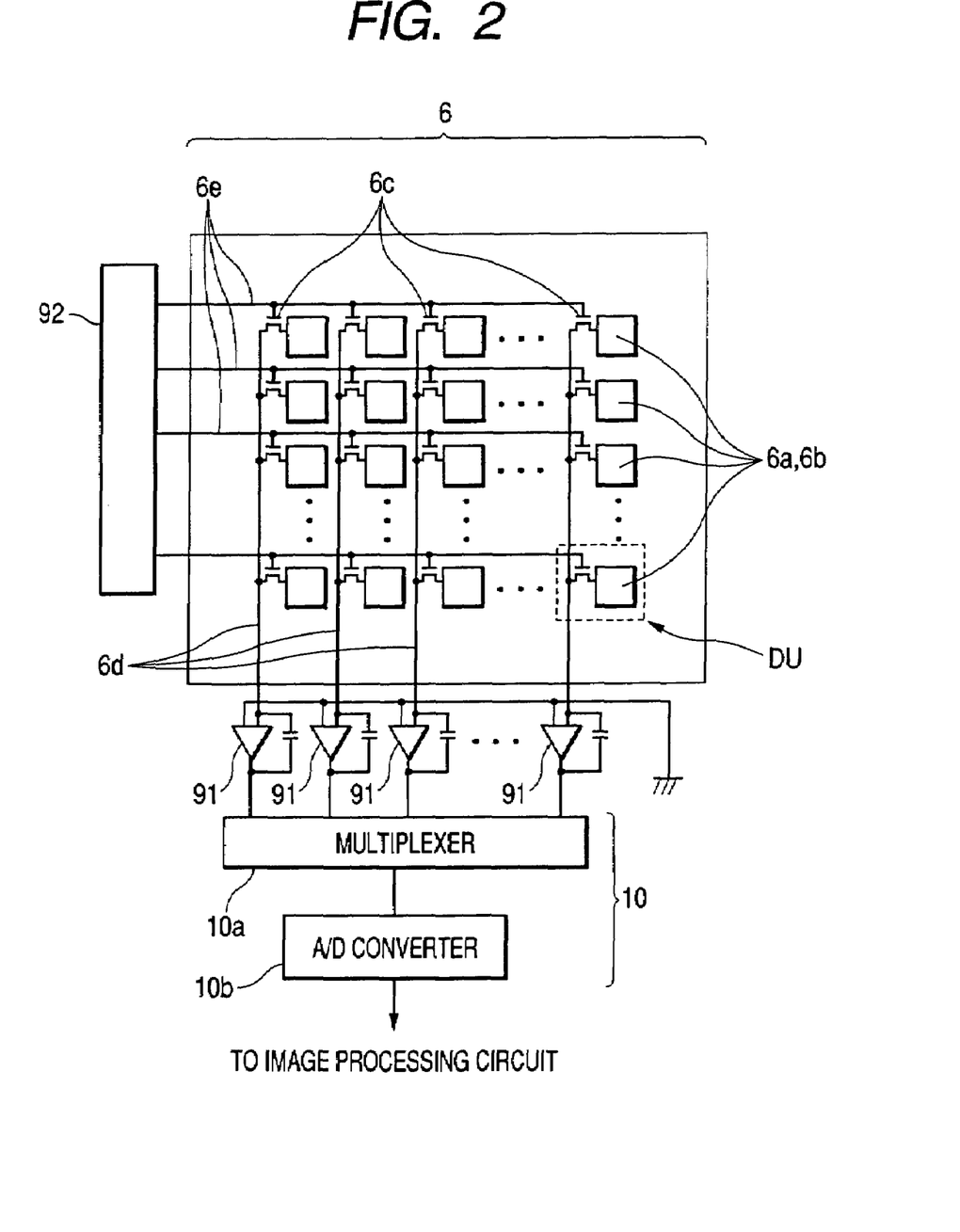
FIG. 2 is a drawing to show the circuit configuration of an active matrix substrate of the radiation detection section according to the embodiment of the invention.
Figure 3:
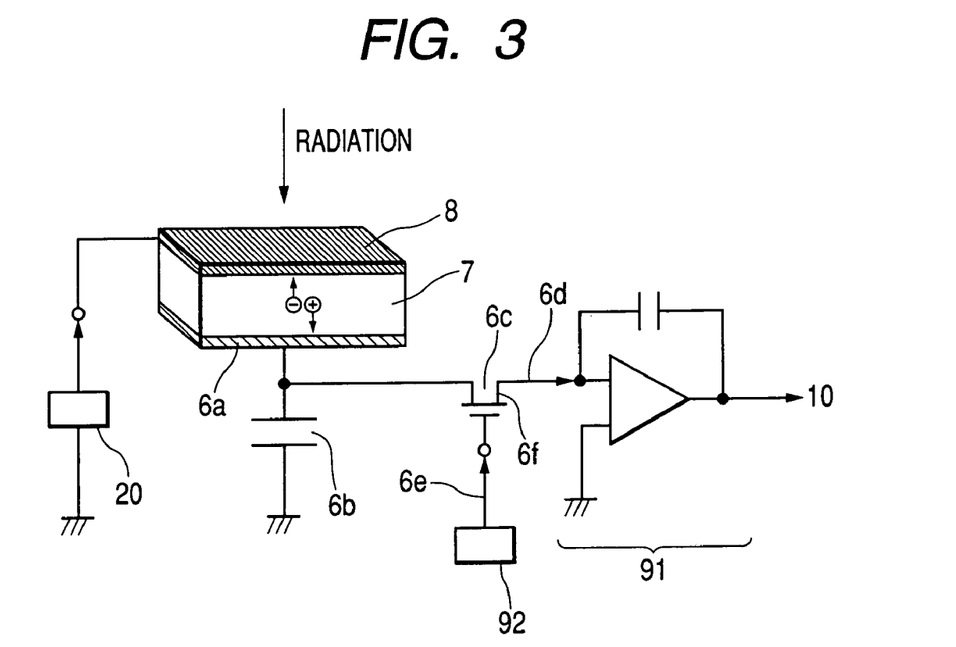
FIG. 3 is a drawing to show the circuit configuration of a unit pixel of the radiation detection section according to the embodiment of the invention.
Figure 4:
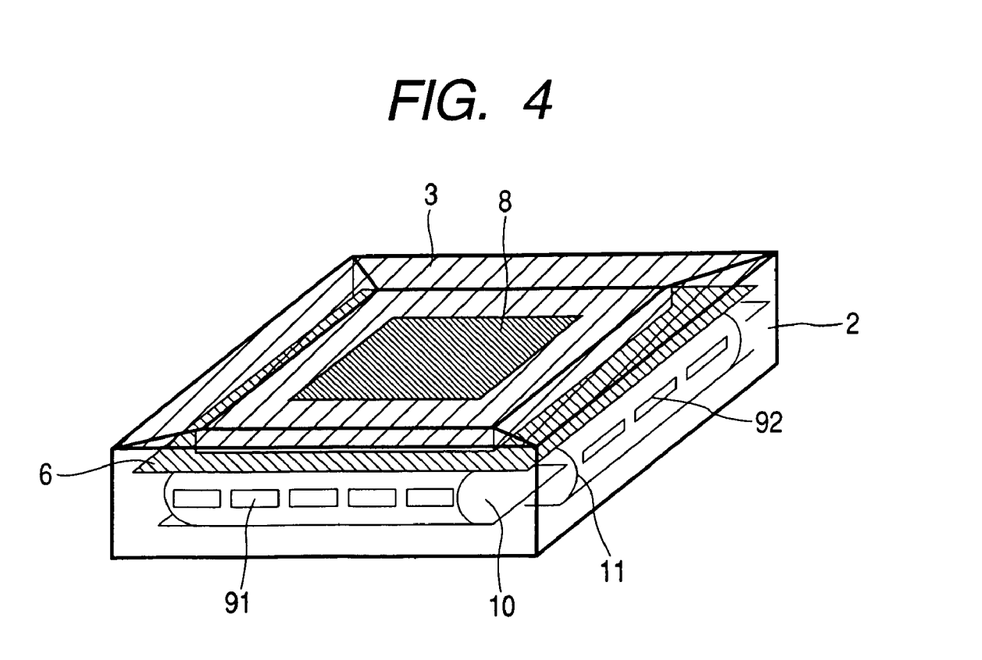
FIG. 4 is a three-dimensional drawing to represent the basic configuration of the radiation detection section according to the embodiment of the invention.
Figure 5:
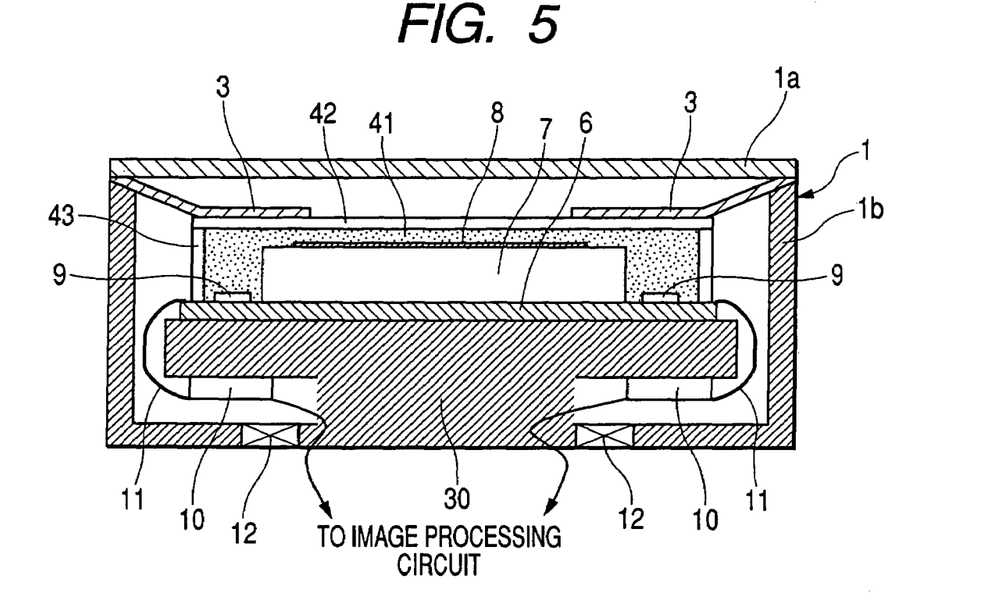
FIG. 5 is a schematic sectional view to show a first modification of the radiation detection section according to the embodiment of the invention.
Figure 6:
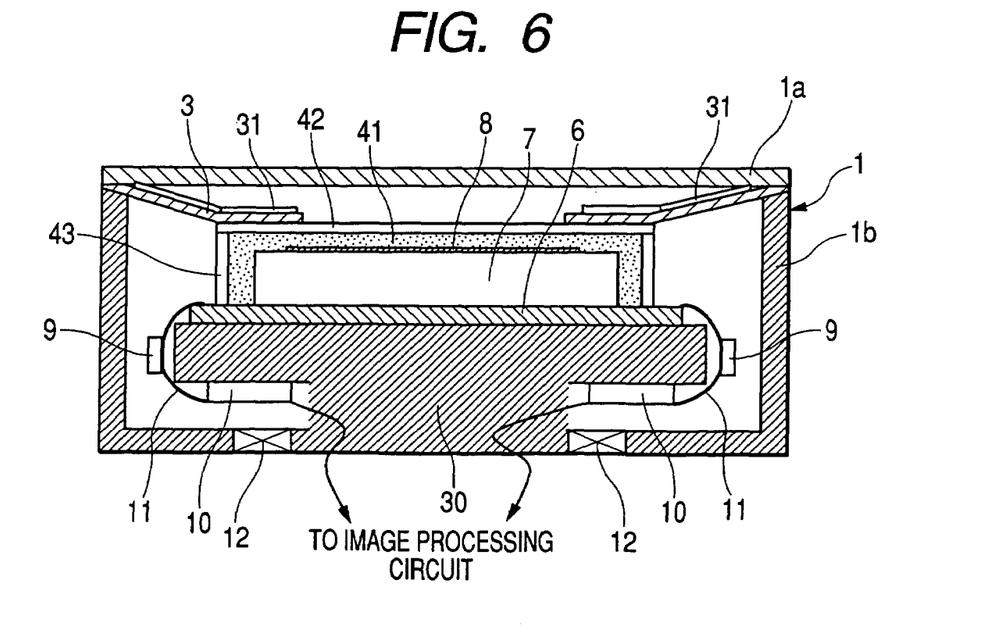
FIG. 6 is a schematic sectional view to show a second modification of the radiation detection section according to the embodiment of the invention.
Figure 7:
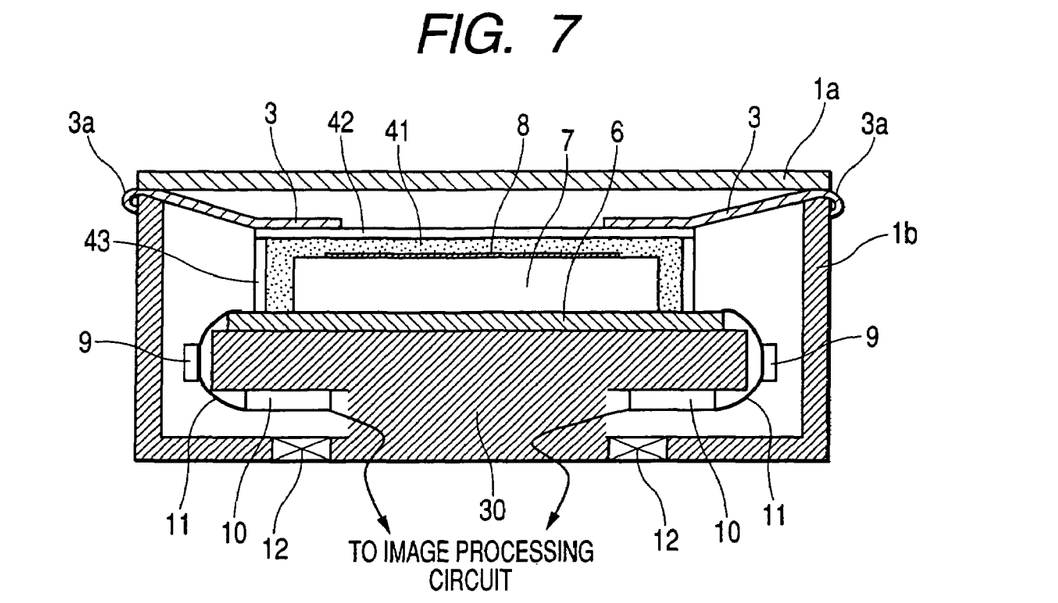
FIG. 7 is a schematic sectional view to show a third modification of the radiation detection section according to the embodiment of the invention.

Referring now to the accompanying drawings, there is shown a preferred embodiment of the invention. FIG. 1 is a schematic sectional view to show the configuration of a radiological image pickup apparatus according to an embodiment of the invention. FIG. 2 is a drawing to show the circuit configuration of an active matrix substrate of the radiation detection section according to the embodiment of the invention. FIG. 3 is a drawing to show the circuit configuration of a unit pixel of the radiation detection section according to the embodiment of the invention. FIG. 4 is a three-dimensional drawing to represent the basic configuration of the radiation detection section according to the embodiment of the invention. FIG. 5 is a schematic sectional view to show a first modification of the radiation detection section according to the embodiment of the invention. FIG. 6 is a schematic sectional view to show a second modification of the radiation detection section according to the embodiment of the invention. FIG. 7 is a schematic sectional view to show a third modification of the radiation detection section according to the embodiment of the invention.

As shown in FIG. 1, the radiological image pickup apparatus of the embodiment includes a radiation detection section having an active matrix substrate 6, a radiation-sensitive semiconductor 7, and a voltage application electrode 8. The active matrix substrate 6 is formed with a charge-storage capacitor, a charge read thin-film transistor (TFT) switching element, and a pixel electrode for each unit cell with signal lines and scanning lines disposed like a lattice on the insulating substrate such as a glass substrate. The radiation-sensitive semiconductor 7 is made of amorphous selenium for producing charges as radiation is incident and is formed on the active matrix substrate 6. The voltage application electrode 8 is provided on the surface of the radiation-sensitive semiconductor 7 on which radiation is incident. The radiation-sensitive semiconductor 7 made of amorphous selenium is a high-purity amorphous selenium (a-Se) thick film with specific resistance of $10^9$ Ωcm or more (preferably $10^{11}$ Ωcm or more) and having a film thickness ranging from about 0.5 mm to about 1.5 mm. This a-Se thick film has excellent suitability particularly for putting the detection area into a large area.

The active matrix substrate 6 is connected to a signal processing circuit 10 by a flexible wiring film 11 and is driven by an LSI chip disposed on the film 11, and a signal detected by the radiation-sensitive semiconductor 7 and output through the active matrix substrate 6 is subjected to processing of amplification, etc., by the LSI chip 9.

FIG. 2 is a drawing to show the active matrix substrate 6, the configuration of the LSI chip 9, and an outline of the signal processing circuit 10. The active matrix substrate 6 has pixel electrodes 6a and charge-storage capacitors 6b provided in a one-to-one correspondence with the pixel electrodes 6a for temporarily retaining detected signal charges (in FIG. 2, each charge-storage capacitor 6b is positioned below the corresponding pixel electrode 6a). Switching elements 6c are driven on and off for each row by a drive signal supplied through scanning lines 6e and the stored signal charges are output through the switching elements 6c and signal lines 6d and are amplified by charge detection amplifiers 91 and then are output to the signal processing circuit 10. A multiplexer 10a of the signal processing circuit 10 selects the signal for each column in sequence and outputs the signal to an A/D converter 10b, and the signal is subjected to predetermined signal processing in an image processing circuit to provide a photograph image. The charge detection amplifiers 91 and a gate driver 92 are integrated on the LSI chip 9 shown in FIG. 1.

FIG. 3 is a drawing to describe the circuit configuration of the portion corresponding to one pixel unit DU of the active matrix substrate 6, etc. FIG. 3 schematically shows only the portion corresponding to the pixel electrode 6a in the radiation-sensitive semiconductor 7 and the voltage application electrode 8. In FIG. 3, a bias voltage is applied to the voltage application electrode 8 from a bias supply power supply 20 and in the pixel on which radiation is incident, charges produced in response to the interaction with the radiation-sensitive semiconductor 7 are transferred by a bias electric field, whereby the charges are induced to the pixel electrode 6a and are stored in the charge-storage capacitor 6b corresponding to the pixel. The switching element 6c is driven on and off by the gate driver 92. When it is turned on, the stored signal charges are sent through a drain 6f and the signal line 6d to the charge detection amplifier 91, which then amplifies the signal charges and outputs the amplified signal charges to the signal processing circuit 10.

In FIG. 1, the radiation-sensitive semiconductor 7 and the voltage application electrode 8 on the active matrix substrate 6 are molded so as to cover the whole of the radiation-sensitive semiconductor 7 and the voltage application electrode 8 in such a manner that an insulating substance 41 such as an epoxy adhesive is poured into the area surrounded by an insulating weir member 43 made of resin and an insulating plate member 42 such as a glass plate is bonded and formed. Thus, a shield member 3 formed of a conductive material can be brought close to the proximity of the pole of the voltage application electrode 8, and it is made possible to provide the shield effect more perfectly.

Thus, the active matrix substrate 6 is formed in a state in which it is shielded with the radiation-sensitive semiconductor 7 and the voltage application electrode 8. The active matrix substrate 6 is fixed on a bed 30 and is disposed in a cabinet 1. The cabinet 1 is made up of a surface lid section 1a and a non-surface lid section 1b. The surface lid section 1a is formed of a nonconductive material of plastic, etc., and the non-surface lid section 1b is formed of a conductive material. A cooling fan 12 is disposed at the bottom of the non-surface lid section 1b for releasing air in the cabinet 1 into the outside to provide a cooling function.

The structure is adopted, whereby a capacitor is not formed between the voltage application electrode and the surface lid section of the cabinet and when a bias voltage is applied, charges are not stored. Thus, if the cooling fan, etc., causes the surface lid section to vibrate, charge transfer does not occur and noise is not detected. Consequently, it is made possible to thin as much as possible the surface lid section of the cabinet also serving as an incidence window member of radiation.

On the insulating plate member 42, the shield member 3 made of a conductive material is disposed and shields in the area from the outer frame of the cabinet 1 to the margin of the voltage application electrode 8 so as to cover the area other than the portion just above the voltage application electrode 8. FIG. 4 is a three-dimensional drawing to represent the shield relationship; the hatched portion is the shield portion of the shield member 3 and the black portion of the voltage application electrode 8 is an opening. FIG. 4 is a schematic drawing and the portion of the non-surface lid section 1b is transparent; in fact, however, it need not be transparent and the surface lid section 1a of the cabinet 1 (FIG. 1) is removed in FIG. 4.

The structure is adopted, whereby electrostatic noise occurring as the surface lid section 1a vibrates with vibration of the cooling fan 12, etc., with the surface lid section 1a naturally charged does not enter the charge detection amplifiers 91 or the gate driver 92 and does not have a detrimental effect thereon. Therefore, it is made possible to thin as much as possible the surface lid section 1a of the cabinet 1 also serving as an incidence window member of radiation.

The radiation-sensitive semiconductor 7 and the voltage application electrode 8 on the active matrix substrate 6 are molded by using the insulating substance 41, the insulating plate member 42, and the insulating weir member 43 so as to cover the whole of the radiation-sensitive semiconductor 7 and the voltage application electrode 8. Therefore, the shield member 3 can be brought close to the proximity of the pole of the voltage application electrode 8 and the shield effect is provided more perfectly.

Preferably, the surface lid section 1a of the cabinet 1 is formed of a nonconductive material on the full face as in the embodiment; however, the effect is provided if at least the portion of the surface lid section 1a of the cabinet 1 opposed to the voltage application electrode 8 is nonconductive. The surface lid section 1a may be formed using a plate member of a nonconductive material corresponding to the portion opposed to the voltage application electrode 8 and a plate member formed of a conductive material forming any other portion in combination. The surface lid section 1a may be shaped like a curved surface rather than a flat plate. Various commercially available materials other than plastic can also be applied; it is desirable that a material having a high light blocking effect should be used or light shield treatment should be conducted so as to block visible light. Further, it is desirable that the non-surface lid section 1b should be formed of a conductive material, but all need not necessarily be formed of a conductive material.

Resin material (plastic) of ABS, phenol, vinyl chloride, melamine, fluorine, acryl, polycarbonate, etc., or a non-resin material of glass, ceramics, etc., can be used as the nonconductive material used for the surface lid section 1a of the cabinet 1. An alloy consisting essentially of Al, Fe, Ti, Cu, Co, Ni, etc., or a molded article consisting essentially of carbon can be used as the conductive material used for the cabinet 1 and the surface lid section 1a.

In the example in FIG. 1, the insulating substance 41 such as an epoxy adhesive is poured into the area surrounded by the insulating weir member 43 made of resin and the insulating plate member 42 such as a glass plate is bonded and formed, but the invention is not limited to the example. The invention is also applied to a structure wherein the insulating plate member 42 such as a glass plate does not exist, for example.

A plate member or a tape member consisting essentially of aluminum, copper, etc., is also possible as the material of the shield member, but the material is not limited to it. If the shield area is made to overlap the inside of the margin of the voltage application electrode 8 about as much as the thickness of the insulating substance 41 for mold, the shield effect can be provided more reliably. Further, if the rigidity of the insulating substance 41 is high like epoxy in the embodiment and a sufficient thickness that can resist a dielectric breakdown can be provided or the insulating plate member 42 is covered with a hard material such as glass, the shield area of the shield member 3 may be a shape covering the whole portion rather than opening just above the voltage application electrode 8.

Next, first to third modifications of the radiological image pickup apparatus according to the embodiment will be discussed. Parts identical with those previously described with reference to FIG. 1 are denoted by the same reference numerals in FIGS. 5 to 7. To begin with, in the first modification in FIG. 5, the LSI chip 9 on which the charge detection amplifiers 91 and the gate driver 92 are integrated shown in FIG. 2 is formed on active matrix substrate 6 and the structure is molded by using insulating substance 41, insulating plate member 42, and insulating weir member 43 so as to cover the whole of the LSI chip 9 together with radiation-sensitive semiconductor 7 and voltage application electrode 8. The structure is adopted, whereby the whole can be made a flat shape and shield of shield member 3 can be conducted easily and reliably. In FIG. 5, the LSI chip 9 having the charge detection amplifiers 91 and the gate driver 92 shown in FIG. 2 is installed on the active matrix substrate 6 using a wire and a bump (not shown), but may be formed integrally on the active matrix substrate 6 using a method of photolithography, etc., like thin-film transistor (TFT) switching elements.

In the second modification in FIG. 6, an accessory plate 31 made of a material of metal with high atom number 40 or more, for example, Mo (42), Ag (47), In (49), Sn (50), W (74), or Pb (82) is disposed on shield member 3 made of a conductive material, for example, a copper plate for shielding the area from the outer frame of cabinet 1 to the margin of voltage application electrode 8 by screwing or with an adhesive or a solvent. The material acts as a shield material of radiation and can protect the parts of charge detection amplifiers 91 and gate driver 92 integrated on LSI chip 9 easily affected by radiation damage.

In FIG. 6, the accessory plate 31 made of metal with high atom number is disposed on the shield member 3, but maybe attached to the lower part of the shield member 3. The shield member 3 itself may be made of the accessory plate 31 made of metal with a high atom number. The material made of metal with the high atom number mentioned here may be, for example, a material whose part is metal with high atom number as an Al plate and a Pb plate are used in combination to provide strength.

Further, in the third modification in FIG. 7, shield member 3 for shielding the area from cabinet 1 to the margin of voltage application electrode 8 is provided with an extension 3a for electrically connecting to the extension of non-surface lid section 1b of cabinet 1 made of a conductive material. The connection method is not limited and may be a conductor, conductive paste, crimp, screwing, etc. The extension of the non-surface lid section 1b of the cabinet 1 and the shield member 3 are thus connected, whereby it is made possible to more enhance the shield effect on LSI chip 9, etc.

In the radiological image pickup apparatus of the embodiment and the first to third modifications described above, the high-purity amorphous selenium (a-Se) thick film having a film thickness ranging from about 0.5 mm to about 1.5 mm is taken as an example of the radiation-sensitive semiconductor 7. However, the thickness can also be changed and an amorphous semiconductor of selenium doped with alkali metal of Na, etc., halogen of Cl, etc., As, or Te or a selenium compound can also be used depending on the type and application of radiation. Any semiconductor of CdTe, CdZnTe, PbI2, HgI2, GaAs, Si, etc., other than selenium may be used.

However, the advantages of the invention remarkably appear particularly when a high bias voltage is applied for use like an amorphous semiconductor of amorphous selenium or a selenium compound, because the higher the bias voltage, the more easily charges are stored in the capacitor formed between the voltage application electrode 8 and the portion corresponding to the surface lid section 1a of the cabinet 1.

A charge blocking layer or a buffer layer may be provided on both or either of the upper and lower layers of the radiation-sensitive semiconductor 7; they are collectively defined as the radiation-sensitive semiconductor 7 in the radiation detection section according to the embodiment. As examples of the charge blocking layer and the buffer layer, an amorphous semiconductor layer of selenium or a selenium compound containing As or Te, an amorphous semiconductor layer of selenium or a selenium compound doped with a minute amount of halogen, alkali metal, etc., a high-resistance semiconductor layer of Sb2S3, CeO2, CdS, etc., or the like can be named.

The voltage application electrode 8 is formed of proper metal selected from among Au, Pt, Al, Ni, In, and the like or ITO, etc. Of course, the materials of the radiation-sensitive semiconductor 7, the charge blocking layer, the buffer layer, and the voltage application electrode 8 are not limited to those mentioned above.

Preferably, the non-surface lid section 1*b* of the cabinet 1 is electrically connected to ground potential. In FIG. 1, the active matrix substrate 6 and the cabinet are fixed directly with an adhesive, a pressure sensitive adhesive, a fixture, or the like, but the invention is also applied to the case where they are fixed indirectly using any other jig of an Al plate, etc.

According to the radiological image pickup apparatus according to the first or second aspect of the present invention, the portion corresponding to the surface lid section of the cabinet is formed using a nonconductive material, so that a capacitor is not formed between the voltage application electrode and the surface lid section of the cabinet and when a bias voltage is applied, charges are not stored. Thus, if the surface lid section of the cabinet vibrates, noise does not occur. Consequently, it is made possible to thin as much as possible the surface lid section of the cabinet as an incidence window member of radiation. Thus, the S/N ratio can be improved largely.

According to the radiological image pickup apparatus according to the third aspect of the present invention, further any other portion than the portion in the cabinet opposed to the voltage application electrode is formed of a conductive material, so that the noise problem caused by vibration of the surface lid section can be solved as in the invention as claimed in claim 1 or 2, and it is made possible to sufficiently shield the inside from an external magnetic field, etc., and it is made possible to detect radiation with less noise.

According to the radiological image pickup apparatus according to the fourth aspect of the present invention, the area from the outer frame of the cabinet to the margin of the voltage application electrode is shielded by a conductive material so as to cover any other area than the portion just above the voltage application electrode, so that electrostatic noise occurring as the surface lid section of the cabinet formed using a nonconductive material of plastic, etc., vibrates with the surface lid section naturally charged is prevented from entering the charge detection amplifiers or the gate driver. The radiation-sensitive semiconductor and the voltage application electrode on the active matrix substrate are molded by using the insulating substance so as to cover the whole, so that the conductive material can be brought close to the proximity of the pole of the voltage application electrode and it is made possible to provide the shield effect more perfectly.

According to the radiological image pickup apparatus of the fifth aspect of the preset invention, the charge detection amplifiers and the gate driver are formed on the active matrix substrate and the structure is molded by using the insulating substance so as to cover the whole together with the radiation-sensitive semiconductor and the voltage application electrode, so that the whole can be made a flat shape and shield with the conductive material can be conducted easily and reliably to the proximity of the pole of the voltage application electrode.

According to the radiological image pickup apparatus of the sixth aspect of the present invention, the conductive material for shielding the area from the outer frame of the cabinet to the margin of the voltage application electrode is a material made of metal with a high atom number such as tungsten (W) or lead (Pb) or a material whose part is the metal with a high atom number, so that the material acts as a shield material of radiation and can protect the parts of the charge detection amplifiers and the gate driver easily affected by radiation damage, and the product life can be improved.

According to the radiological image pickup apparatus of the seventh aspect of the present invention, the conductive material for shielding the area from the outer frame of the cabinet to the margin of the voltage application electrode is electrically connected to the conductive portion of the cabinet, so that the shield effect can be provided more reliably.

Particularly, to use the invention for a medical diagnosis apparatus, the S/N ratio is improved and thus the application amount of radiation can be reduced and exposure of patients and diagnosis technicians to radiation can be decreased.

What is claimed is:

1. A radiological image pickup apparatus comprising:
    a radiation detection section including an active matrix substrate, a radiation-sensitive semiconductor formed on the active matrix substrate, and a voltage application electrode formed on the radiation-sensitive semiconductor, the active matrix substrate including a charge-storage capacitor, a charge read switching element, and a pixel electrode for each unit cell with signal lines and scanning lines disposed like a lattice on the substrate; and
    a cabinet for retaining said radiation detection section therein,
    wherein at least a portion just above the voltage application electrode is formed of a nonconductive material in a surface lid section of said cabinet opposed to the voltage application electrode.

2. The radiological image pickup apparatus as claimed in claim 1, wherein any portion, other than the nonconductive material portion in said cabinet, is formed of a conductive material.

3. The radiological image pickup apparatus as claimed in claim 2, wherein the radiation-sensitive semiconductor and the voltage application electrode on the active matrix substrate are molded by using an insulating substance so as to entirely cover the radiation-sensitive semiconductor and the voltage application electrode with the insulating substance, and wherein
    a shield member made of a conductive material is formed so as to cover any area, other than the portion just above the voltage application electrode, from a side wall of said cabinet to a margin of the voltage application electrode.

4. The radiological image pickup apparatus as claimed in claim 3, wherein the shield member is electrically connected to a portion formed of a conductive material in an extension of said cabinet.

5. The radiological image pickup apparatus as claimed in claim 4, wherein charge detection amplifiers and a gate driver connected to ends of the signal lines and the scanning lines on the active matrix substrate are formed on the active matrix substrate and molded by using the insulating substance.

6. The radiological image pickup apparatus as claimed in claim 4, wherein the shield member is formed of a material selected from the group consisting of:
    materials made of metal with an atom number in the range of 40 to 90.

7. The radiological image pickup apparatus as claimed in claim 1, wherein the surface lid section of said cabinet is entirely formed of a nonconductive material.

8. The radiological image pickup apparatus as claimed in claim 7, wherein any portion, other than the nonconductive material portion in said cabinet, is formed of a conductive material.

9. The radiological image pickup apparatus as claimed in claim 8, wherein the radiation-sensitive semiconductor and the voltage application electrode on the active matrix substrate are molded by using an insulating substance so as to entirely cover the radiation-sensitive semiconductor and the voltage application electrode with the insulating substance, and wherein a shield member made of a conductive material is formed so as to cover any area, other than the portion just above the voltage application electrode, from a side wall of said cabinet to a margin of the voltage application electrode.

10. The radiological image pickup apparatus as claimed in claim 9, wherein the shield member is electrically connected to a portion formed of a conductive material in an extension of said cabinet.

11. The radiological image pickup apparatus as claimed in claim 10, wherein charge detection amplifiers and a gate driver connected to ends of the signal lines and the scanning lines on the active matrix substrate are formed on the active matrix substrate and molded by using the insulating substance.

12. The radiological image pickup apparatus as claimed in claim 11, wherein the shield member is formed of a material selected from the group consisting of:

materials made of metal with an atom number in the range of 40 to 90.

13. The radiological image pickup apparatus as claimed in claim 7, wherein the radiation-sensitive semiconductor and the voltage application electrode on the active matrix substrate are molded by using an insulating substance so as to entirely cover the radiation-sensitive semiconductor and the voltage application electrode with the insulating substance, and wherein a shield member made of a conductive material is formed so as to cover any area, other than the portion just above the voltage application electrode, from a side wall of said cabinet to a margin of the voltage application electrode.

14. The radiological image pickup apparatus as claimed in claim 13, wherein the shield member is electrically connected to a portion formed of a conductive material in an extension of said cabinet.

15. The radiological image pickup apparatus as claimed in claim 14, wherein charge detection amplifiers and a gate driver connected to ends of the signal lines and the scanning lines on the active matrix substrate are formed on the active matrix substrate and molded by using the insulating substance.

16. The radiological image pickup apparatus as claimed in claim 14, wherein the shield member is formed of a material selected from the group consisting of:

materials made of metal with an atom number in the range of 40 to 90.

17. The radiological image pickup apparatus as claimed in claim 1, wherein the radiation-sensitive semiconductor and the voltage application electrode on the active matrix substrate are molded by using an insulating substance so as to entirely cover the radiation-sensitive semiconductor and the voltage application electrode with the insulating substance, and wherein a shield member made of a conductive material is formed so as to cover any area, other than the portion just above the voltage application electrode, from a side wall of said cabinet to a margin of the voltage application electrode.

18. The radiological image pickup apparatus as claimed in claim 17, wherein the shield member is electrically connected to a portion formed of a conductive material in an extension of said cabinet.

19. The radiological image pickup apparatus as claimed in claim 18, wherein charge detection amplifiers and a gate driver connected to ends of the signal lines and the scanning lines on the active matrix substrate are formed on the active matrix substrate and molded by using the insulating substance.

20. The radiological image pickup apparatus as claimed in claim 18, wherein the shield member is formed of a material selected from the group consisting of:

materials made of metal with an atom number in the range of 40 to 90.

* * * * *